United States Patent
Wang

(10) Patent No.: US 9,847,756 B1
(45) Date of Patent: Dec. 19, 2017

(54) WIRELESS COMMUNICATION DEVICE AND WIRELESS COMMUNICATION METHOD

(71) Applicant: KABUSHIKI KAISHA TOSHIBA, Tokyo (JP)

(72) Inventor: Tong Wang, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/444,233

(22) Filed: Feb. 27, 2017

(30) Foreign Application Priority Data

Sep. 15, 2016 (JP) ................................. 2016-180773

(51) Int. Cl.
*H04B 1/02* (2006.01)
*H03F 1/02* (2006.01)
(Continued)

(52) U.S. Cl.
CPC ............. *H03F 1/0205* (2013.01); *H03F 1/56* (2013.01); *H03F 3/193* (2013.01); *H03F 3/211* (2013.01);
(Continued)

(58) Field of Classification Search
CPC ........... H03C 7/02; H03C 1/00; H03F 1/0205; H03F 1/56; H03F 3/193; H03F 3/211;
(Continued)

(56) References Cited

U.S. PATENT DOCUMENTS 7,053,708 B2    5/2006  Nagamori et al.
7,429,890 B2 *  9/2008  Lee .......................... H03F 1/26
                                                                    330/10
(Continued)

FOREIGN PATENT DOCUMENTS

JP    2004328555 A    11/2004
JP    2008113424 A     5/2008
(Continued)

OTHER PUBLICATIONS

Jonas Fritzin et al., "Design and Analysis of a Class-D Stage With Harmonic Suppression", IEEE Transactions on Circuits and Systems-I: Regular Papers, vol. 59, No. 6, Jun. 2012, pp. 1178-1186.

(Continued)

*Primary Examiner* — Nhan Le
(74) *Attorney, Agent, or Firm* — Patterson & Sheridan, LLP

(57) ABSTRACT

A wireless communication device includes a signal generator supply a signal to an input node to which a power amplifier is connected. The power amplifier includes an inverter including a first transistor with a gate connected to the input node via a first signal path and a second transistor with a gate electrode connected to the input node via a second signal path. An output signal corresponding to the signal supplied to the input node is supplied from an output node between the first and second transistors. A filter is connected to the output node and outputs a filtered signal having a high frequency component removed. A bias application unit applies a first bias voltage to the first signal path and a second bias voltage to the second signal path. Levels of the bias voltages being set according to a direct current component in the filtered signal.

20 Claims, 7 Drawing Sheets

(51) Int. Cl.
*H03F 3/21* (2006.01)
*H03F 1/56* (2006.01)
*H03F 3/193* (2006.01)
*H04B 1/04* (2006.01)
*H04B 1/18* (2006.01)

(52) U.S. Cl.
CPC ............ *H04B 1/0458* (2013.01); *H04B 1/18* (2013.01); *H03F 2200/351* (2013.01); *H03F 2200/462* (2013.01); *H03F 2203/21127* (2013.01); *H03F 2203/21139* (2013.01); *H03F 2203/21142* (2013.01); *H03F 2203/21157* (2013.01); *H04B 2001/0408* (2013.01)

(58) Field of Classification Search
CPC ......... H03F 2200/351; H03F 2200/462; H03F 2203/21127; H03F 2203/21139; H03F 2203/21157; H04B 1/0458; H04B 1/18; H04B 2001/0408; H04B 2001/0416
USPC .......................................... 455/107, 118, 126
See application file for complete search history.

(56) References Cited

U.S. PATENT DOCUMENTS

| | | | |
|---|---|---|---|
| 7,786,795 B2 | 8/2010 | Shimizu | |
| 8,022,757 B2 | 9/2011 | Takagi et al. | |
| 8,115,540 B2 | 2/2012 | Nose et al. | |
| 8,818,304 B2 | 8/2014 | Shimizu | |
| 9,673,782 B1* | 6/2017 | Andrabi | H03H 11/1217 |
| 2015/0171856 A1 | 6/2015 | Yoo et al. | |
| 2016/0087595 A1* | 3/2016 | Gopalraju | H02M 3/158 323/271 |
| 2016/0359521 A1* | 12/2016 | Zhou | H04B 1/123 |
| 2017/0207760 A1* | 7/2017 | Werking | H03F 3/45475 |

FOREIGN PATENT DOCUMENTS

| | | |
|---|---|---|
| JP | 5095312 B2 | 12/2012 |
| JP | 5267127 B2 | 8/2013 |
| JP | 5442636 B2 | 3/2014 |
| JP | 5537461 B2 | 7/2014 |
| JP | 2015119481 A | 6/2015 |

OTHER PUBLICATIONS

Tomohiro Sang et al., "A 6.3mW BLE Transceiver Embedded RX Image-Rejection Filter and TX Harmonic-Suppression Filter Reusing On-Chip Matching Network", IEEE International Solid-State Circuits Conference, Session 13, Energy-Efficient RF Systems, Feb. 24, 2015, 3 pages.

* cited by examiner

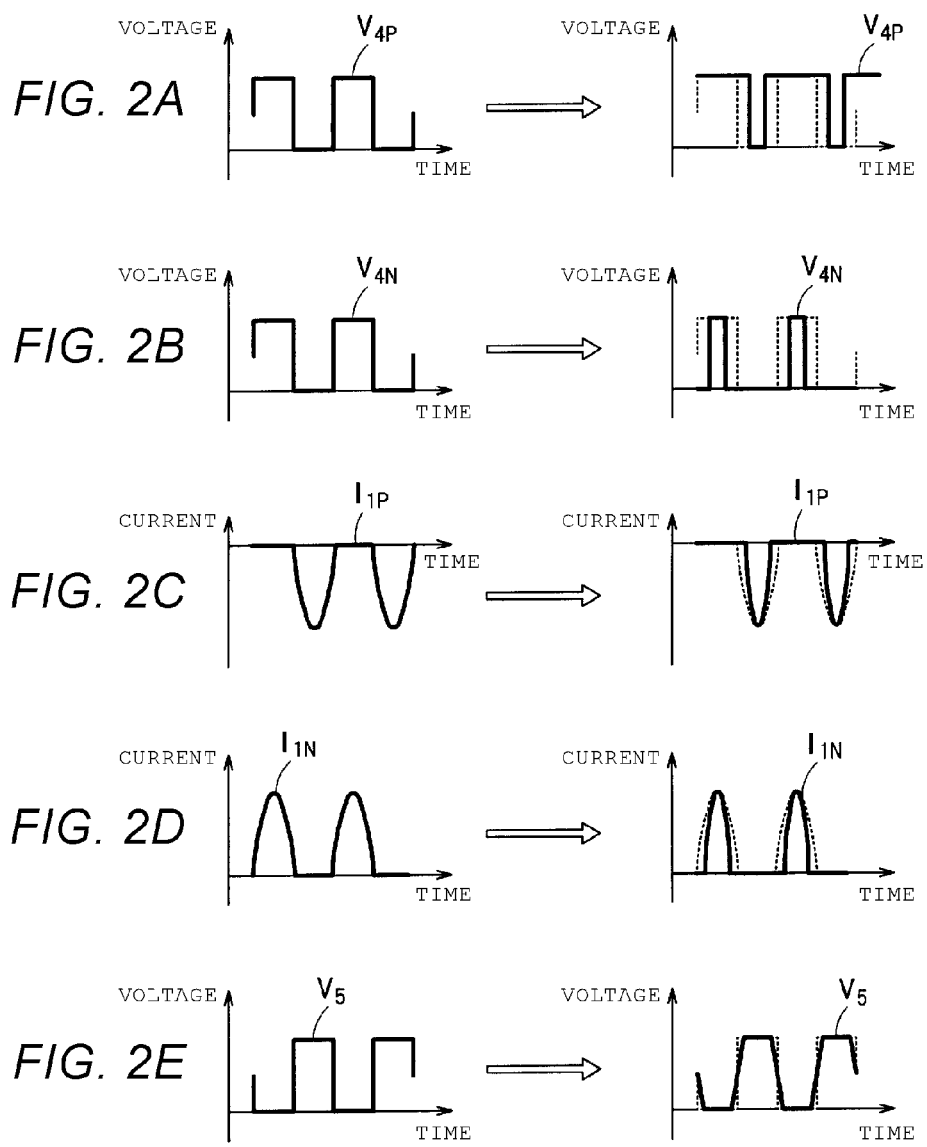

WIRELESS COMMUNICATION DEVICE AND WIRELESS COMMUNICATION METHOD

CROSS-REFERENCE TO RELATED APPLICATION

This application is based upon and claims the benefit of priority from Japanese Patent Application No. 2016-180773, filed Sep. 15, 2016, the entire contents of which are incorporated herein by reference.

FIELD

Embodiments described herein relate generally to a wireless communication device and a wireless communication method.

BACKGROUND

When a power amplifier of a wireless communication device comprises an inverter, it is preferable to make the conduction period (duty ratio) of a pMOS (p-channel) transistor in the inverter and the conduction period (duty ratio) of a nMOS (n-channel) transistor in the inverter the same or substantially so. The reason is being that if the duty ratios are not uniform, symmetry of output signal waveforms output from the power amplifier will be deteriorated and even-order harmonic components in the output signals can be increased. For that reason, the waveform of the output signal needs to be adjusted to a desired waveform by control of the duty ratio(s).

DESCRIPTION OF THE DRAWINGS

FIGS. 2A to 2E are waveform diagrams for explaining operations of the wireless communication device of the first embodiment.

DETAILED DESCRIPTION

In general, according to one embodiment, a wireless communication device comprises a signal generator configured to generate a signal and supply the signal to a first input node. A first power amplifier is connected to the first input node and includes a first inverter comprising a first transistor having a first gate electrode connected to the first input node via a first signal path and a second transistor having a second gate electrode connected to the first input node via a second signal path. The first power amplifier is configured to supply a first output signal corresponding to the signal supplied by the signal generator to the first input node. The first output signal is supplied from a first output node between the first and second transistors. A filter circuit is connected to the first output node and configured to output a filtered output signal corresponding to the first output signal having a high frequency component removed therefrom. A bias application unit is configured to apply a first bias voltage to the first signal path and a second bias voltage to the second signal path, a level of the first bias voltage and a level of the second bias voltage being set according to a direct current component in the filtered output signal.

In the following, example embodiments of the disclosure will be described with reference to the drawings.

First Embodiment

Figure 1:
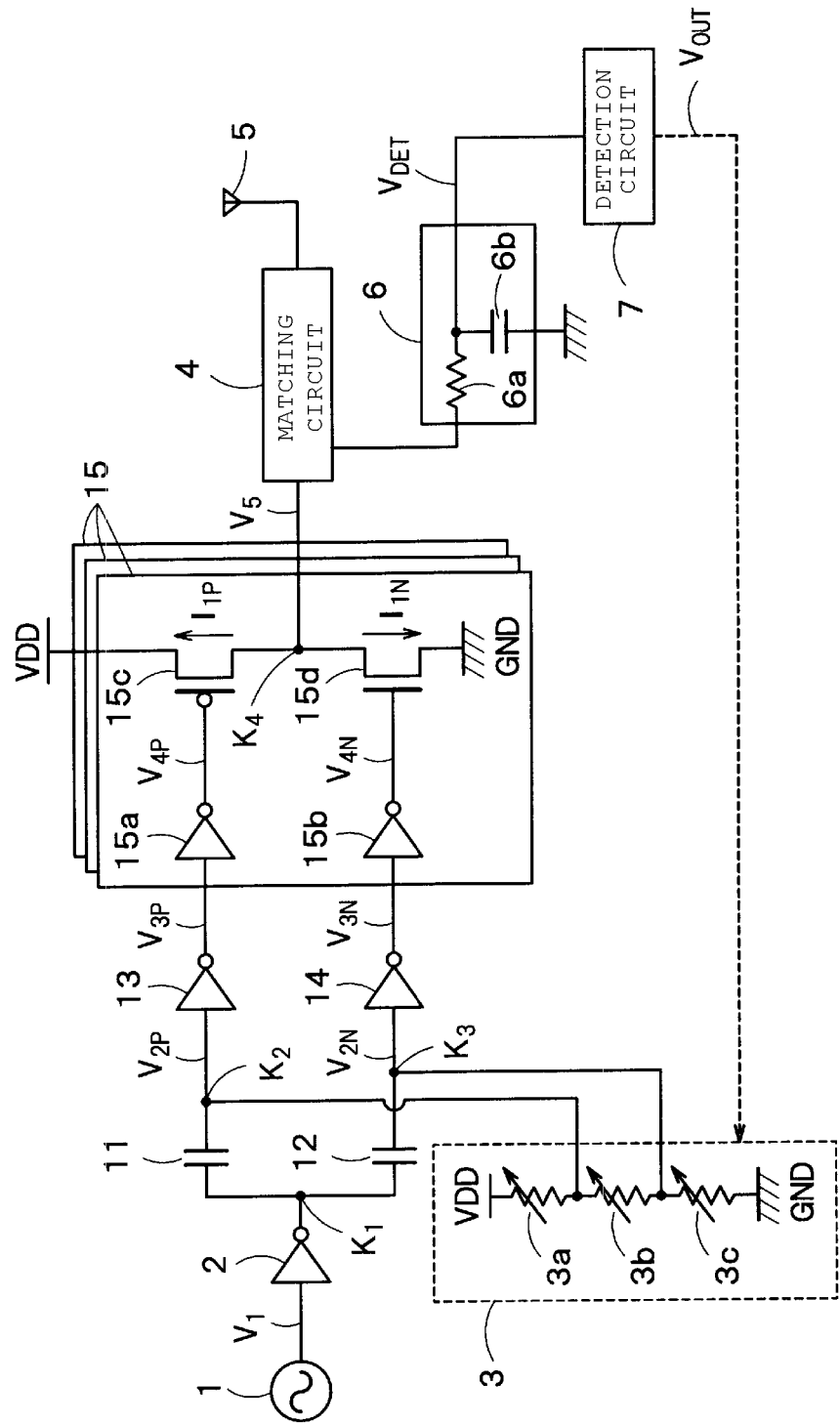
FIG. 1 is a circuit diagram illustrating a configuration of a wireless communication device of a first embodiment.

FIG. 1 is a circuit diagram illustrating a configuration of a wireless communication device of a first embodiment. The wireless communication device of FIG. 1 includes a signal generation unit 1, an inverter 2, a bias application unit 3, a matching circuit 4, an antenna 5, a filter circuit 6, and a detection circuit 7. The bias application unit 3 includes a first variable resistor 3a, a second variable resistor 3b, and a third variable resistor 3c. The filter circuit 6 includes an electrical resistor 6a and a capacitor 6b.

The wireless communication device of FIG. 1 further includes a first capacitor 11, a second capacitor 12, a first inverter 13, a second inverter 14, and a plurality of power amplifiers 15 connected in parallel to each other. Each power amplifier 15 includes a third inverter 15a, a fourth inverter 15b, a first transistor 15c, and a second transistor 15d. The wireless communication device of the first embodiment performs wireless transmission based on, for example, the Bluetooth® specifications. In FIG. 1, elements related to description of wireless transmission of the first embodiment are specifically illustrated and other known elements not particularly related to the description of wireless transmission of the first embodiment are omitted for simplicity. The antenna 5 may be an external element or may be an integrated component of the wireless communication device of the first embodiment.

The signal generation unit 1 is a circuit that generates a signal and is, for example, a synthesizer or a digitally controlled oscillator (DCO). In FIG. 1, the signal is represented by a reference symbol $V_1$. Although the signal generation unit 1 generates a sinusoidal wave as the signal $V_1$, the waveform of the signal $V_1$ can be shaped to approach a rectangular wave by the influence of inverters 2, 13, and 14 as the signal V1 propagates downstream.

The signal $V_1$ generated from the signal generation unit 1 is separated at a node $K_1$ into a first signal supplied to the first capacitor 11 and a second signal supplied to the second capacitor 12 after passing through the inverter 2. The first capacitor 11 and the second capacitor 12 eliminate DC components in the first signal and the second signal, respectively.

The first signal passing through the first capacitor 11 is supplied to a gate terminal of the first transistor 15c after first passing through the first inverter 13 and the third inverter 15a in sequence. The second signal passing through the second capacitor 12 is supplied to a gate terminal of the second transistor 15d after first passing through the second inverter 14 and the fourth inverter 15b in sequence. The first transistor 15c is a pMOS transistor and the second transistor 15d is an nMOS transistor. The first transistor 15c and the second transistor 15d collectively constitute an inverter. The first transistor 15c and the second transistor 15d are connected in series between a power source wiring line (VDD wiring line) and a ground wiring line (GND wiring line). A plurality of power amplifiers 15 (illustrated in FIG. 1) are connected in parallel to each other at a position of a frame line surrounding each power amplifier 15. That is, wiring lines through which the signal is input to each of the power amplifiers 15 in the plurality are branched at a node between the first inverter 13 and the depicted plurality of power amplifiers 15 and a node between the second inverter 14 and the depicted plurality of power amplifiers 15. Similarly, the wiring lines through which signals are output from the plurality of power amplifiers 15 are converged at a node between the plurality of power amplifiers 15 and the matching circuit 4.

The bias application unit 3 applies a first bias voltage to a node $K_2$ between the first capacitor 11 and the first inverter 13. In FIG. 1, the first signal immediately after the first bias voltage is applied (at node $K_2$) is represented by the reference symbol $V_{2P}$. The first signal after passing through the first inverter 13 is represented by the reference symbol $V_{3P}$. The first signal after passing through the third inverter 15a is represented by the reference symbol $V_{4P}$. Similarly, the bias application unit 3 applies a second bias voltage at a node $K_3$ between the second capacitor 12 and the second inverter 14. In FIG. 1, the second signal immediately after the second bias voltage is applied (at node $K_3$) is represented by the reference symbol $V_{2N}$. The second signal after passing through the second inverter 14 is represented by the reference symbol $V_{3N}$. The second signal after passing through the fourth inverter 15b is represented by the reference symbol $V_{4N}$.

Here, the bias application unit 3 includes a first variable resistor 3a, a second variable resistor 3b, and a third variable resistor 3c connected in series between the VDD wiring line and the GND wiring line. The bias application unit 3 can vary resistance values of the first variable resistor 3a to the third variable resistor 3c to thereby make it possible to independently control values of the first bias voltage and the second bias voltage. The bias application unit 3 can control the first bias voltage to adjust the duty ratio of the first signal and can control the second bias voltage to adjust the duty ratio of the second signal.

Although the bias application unit 3 as depicted in FIG. 1 is configured with the first variable resistor 3a to the third variable resistor 3c, other configurations may also be adopted as long as the first and second bias voltages can be adjusted as necessary to adjust the duty ratios of the first signal and the second signal.

When the first signal $V_{4P}$ is supplied to the first transistor 15c, a first current $I_{1P}$ is output from the first transistor 15c. When the second signal $V_{4N}$ is supplied to the second transistor 15d, a second current $I_{1N}$ is output from the second transistor 15d. As a result, the output signal $V_5$ is output from a node $K_4$ between the first transistor 15c and the second transistor 15d. The first current $I_{1P}$ and the second current $I_{1N}$ corresponds to drain currents of the first transistor 15c and the second transistor 15d, respectively. The output signal $V_5$ corresponds to a voltage of the node $K_4$ and is generated within each power amplifier 15 based on the first current $I_{1P}$ and the second current $I_{1N}$ therein and is output to the matching circuit 4 from the node $K_4$.

The matching circuit 4 is provided for impedance matching between the power amplifier 15 and the antenna 5. The output signal $V_5$ output from the power amplifier(s) 15 passes through the matching circuit 4, is supplied to the antenna 5, and is transmitted from the antenna 5 to the outside.

The output signal $V_5$ passing through the matching circuit 4 is supplied to the detection circuit 7 through the filter circuit 6. The filter circuit 6 is a low-pass filter including an electrical resistor 6a and a capacitor 6b and eliminates a high frequency component of the output signal $V_5$. After the high frequency component is eliminated from the output signal $V_5$ the filtered signal is output as a detection signal $V_{DET}$ to the detection circuit 7. The filter circuit 6 may have any other configuration as long as the filter circuit 6 is able to eliminate the high frequency component of the output signal $V_5$.

The detection circuit 7 is a circuit that detects a DC component of the output signal $V_5$, and specifically, detects the DC component of the output signal $V_5$ using the detection signal $V_{DET}$. The filter circuit 6 of this embodiment eliminates substantially all AC components in the output signal $V_5$ and thus, the detection signal $V_{DET}$ substantially corresponds to the DC component of the output signal $V_5$. Accordingly, the detection circuit 7 is able to detect a value of the DC component of the output signal $V_5$ from a value of the detection signal $V_{DET}$.

The detection circuit 7 outputs a control signal $V_{OUT}$ corresponding to the detected DC component in the output signal $V_5$ to the bias application unit 3. The bias application unit 3 controls the first bias voltage and the second bias voltage based on the control signal $V_{OUT}$ to adjust the duty ratios of the first signal and the second signal. As a result, a waveform of the output signal $V_5$ varies and the output adjusted signal $V_5$ can be supplied to the matching circuit 4, the antenna 5, the filter circuit 6, and the detection circuit 7.

As such, the wireless communication device of this embodiment detects the DC component in the output signal $V_5$ using the detection circuit 7 and then varies the waveform of the output signal $V_5$ based on the detection result from the detection circuit 7. With this process, it is possible to adjust the waveform of the output signal $V_5$ to a desired waveform. Specifically, the wireless communication device of this embodiment operates in such a way that the value of the DC component of the output signal $V_5$ is brought closer to the value VDD/2 to improve symmetry of the waveform of the output signal $V_5$. Here, the VDD represents potential of the VDD wiring line when potential of the GND wiring line is set to zero. In the following, operations of the wireless communication device of the first embodiment will be described in detail.

FIGS. 2A to 2E are waveform diagrams for explaining operations of the wireless communication device of the first embodiment.

FIG. 2A illustrates an example of a first signal $V_{4P}$ before a duty ratio has been adjusted and the first signal $V_{4P}$ after the duty ratio has been adjusted. In the first signal $V_{4P}$ before the duty ratio has been adjusted, the duty ratio is set to 50% (left side of FIG. 2A). On the other hand, in the first signal $V_{4P}$ after the duty ratio has been adjusted, the duty ratio has been changed from 50% and the period during which the first signal $V_{4P}$ is at a high level is longer than the period during which the first signal $V_{4P}$ is at a low level (right side of FIG. 2A).

FIG. 2B illustrates an example of a second signal $V_{4N}$ before a duty ratio has been adjusted and the second signal $V_{4N}$ after the duty ratio has been adjusted. In the second signal $V_{4N}$ before the duty ratio has been adjusted, the duty ratio is set to 50% (left side of FIG. 2B). On the other hand, in the second signal $V_{4N}$ after the duty ratio has been adjusted, the duty ratio has been changed from 50% and a period during which the second signal $V_{4N}$ is at a high level is shorter than a period during which the second signal $V_{4N}$ is at a low level (right side of FIG. 2B).

The high period and the low period of the first signal $V_{4P}$ and the second signal $V_{4N}$ are adjusted so that the output signal $V_5$ become symmetrical.

FIG. 2C illustrates an example of the first current $I_{1P}$ before a duty ratio has been adjusted and the first current $I_{1P}$ after the duty ratio has been adjusted. The first signal $V_{4P}$ varies as in FIG. 2A and thus, a pulse width of the first current $I_{1P}$ becomes shorter.

FIG. 2D illustrates an example of the second current $I_{1N}$ before a duty ratio has been adjusted and the second current $I_{1N}$ after the duty ratio has been adjusted. The second signal $V_{4N}$ varies as in FIG. 2B and thus, a pulse width of the second current $I_{1N}$ becomes shorter.

FIG. 2E illustrates an example of an output signal $V_5$ before a duty ratio has been adjusted and the output signal $V_5$ after the duty ratio has been adjusted. Before the duty ratio is adjusted, the output signal $V_5$ has a rectangular-wave waveform. Accordingly, each pulse of the output signal $V_5$ has a rectangular waveform. On the other hand, after the duty ratio is adjusted, the pulse widths of the first current $I_{1P}$ and the second current $I_{1N}$ become shorter and thus, the waveform of each pulse of the output signal $V_5$ varies from a rectangular shape to a trapezoidal shape.

As a result, a portion where the voltage (output signal $V_5$) and the current (the sum of the first current $I_{1P}$ and the second current $I_{1N}$) overlap each other is decreased at the node $K_4$. With this, it is possible to improve energy efficiency of wireless communication in the first embodiment.

It is preferable to make the waveforms of the output signal $V_5$ symmetrical in order to decrease the high-order harmonic wave components in the signal that is output to the antenna 5. This can be realized by adjusting the high period and low period of the first signal $V_{4P}$ and the second signal $V_{4N}$.

FIGS. 3A to 3E are other waveform diagrams for explaining operations of the wireless communication device of the first embodiment. FIGS. 3A to 3E illustrate a relationship between adjustment of a duty ratio and application of bias by the bias application unit 3.

Figure 3A:
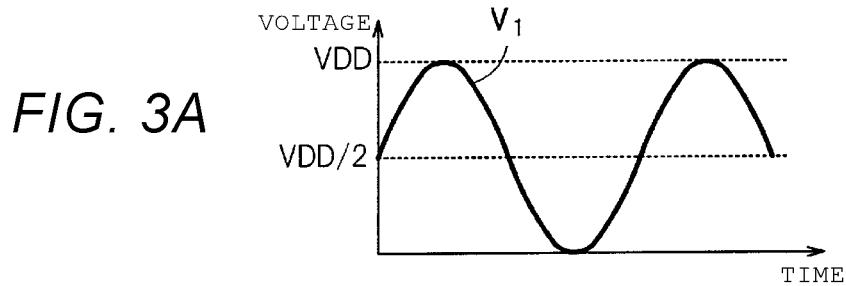
FIGS. 3A to 3E are other waveform diagrams for explaining operations of the wireless communication device of the first embodiment.

FIG. 3A illustrates an example of a signal $V_1$ generated from the signal generation unit 1. Here, the signal $V_1$ is a sinusoidal wave which varies between voltage 0 and voltage VDD. In the following, a first voltage and a first current generated from the signal $V_1$ will be described.

Figure 3B:
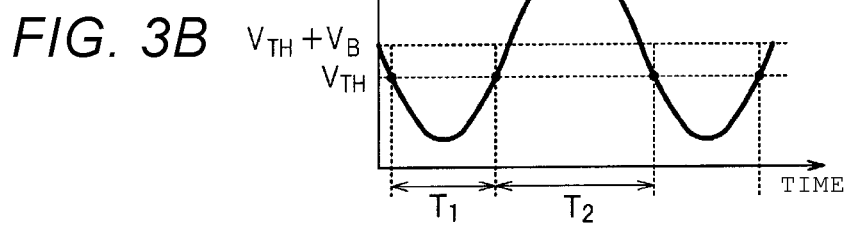

FIG. 3B illustrates first signal $V_{2P}$ immediately after the first bias voltage has been applied. The vibration direction (phase) of the first signal $V_{2P}$ is inverted to the vibration direction (phase) of the signal $V_1$ by action of the inverter 2. An average value of the first signal $V_{2P}$ is higher than a threshold value $V_{TH}$ of the first inverter 13 by a value $V_B$ due to the influence of the first bias voltage. Furthermore, FIG. 3B illustrates a period $T_1$ during which a value of the first signal $V_{2P}$ is lower than the threshold value $V_{TH}$ and a period $T_2$ during which a value of the first signal $V_{2P}$ is higher than the threshold value $V_{TH}$.

Figure 3C:
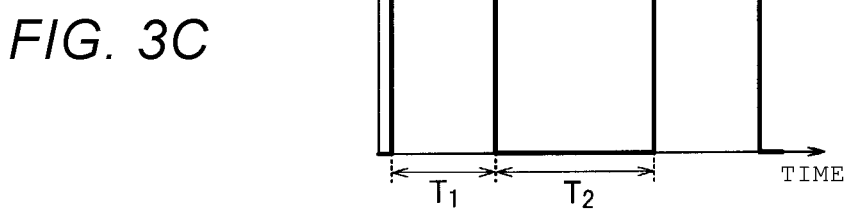

FIG. 3C illustrates a first signal $V_{3P}$ after passing through the first inverter 13. The waveform of the first signal $V_{3P}$ becomes a rectangular wave in which the high period $T_1$ is shorter than the low period $T_2$ due to the influence of the threshold value $V_{TH}$ described above. Although the first signal, in reality, more gradually varies from a sinusoidal wave to a rectangular wave as the first signal propagates downstream, here, for the convenience of plotting drawings, the first signal $V_{2P}$ is represented by a sinusoidal wave and the first signal $V_{3P}$ is represented by a rectangular wave.

Figure 3D:
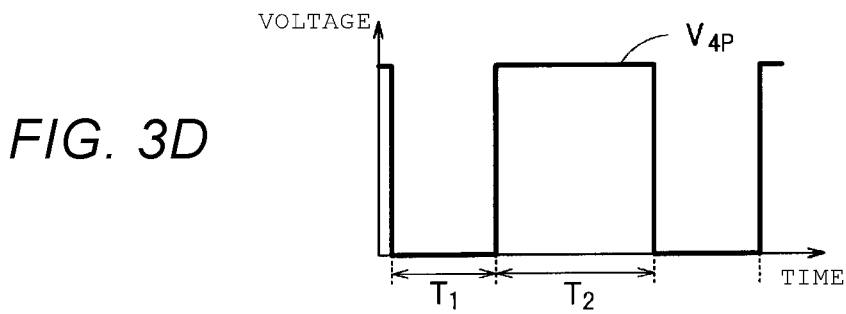

FIG. 3D illustrates the first signal $V_{4P}$ after passing through the third inverter 15a. The waveform of the first signal $V_{4P}$ becomes a rectangular wave in which low period $T_1$ is shorter than the high period $T_2$ due to action of the third inverter 15a.

Figure 3E:
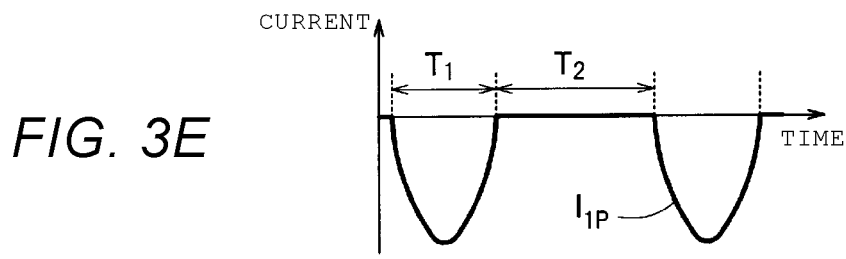

FIG. 3E illustrates the first current $I_{1P}$ output from the first transistor 15c. The pulse width of the first current $I_{1F}$ becomes $T_1$ due to the influence of the low period $T_1$ of the first signal $V_{4P}$.

As such, the duty ratio of the first signal $V_{4P}$ varies according to the first bias voltage and with this, the pulse width of the first current $I_{1P}$ varies. The second current $I_{1N}$ varies similarly. That is, the duty ratio of the second signal $V_{4N}$ varies according to the second bias voltage and with this, the pulse width of the second current $I_{1N}$ varies. As a result, as illustrated in FIG. 2E, it is possible to for the waveform of the output signal $V_5$ to approach the sinusoidal wave. Next, a configuration and operations of the detection circuit 7 of the first embodiment will be described.

Figure 4:
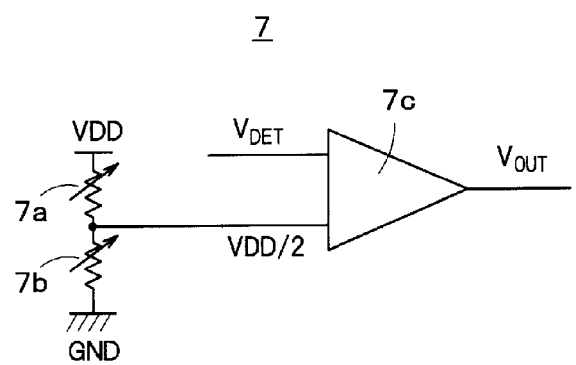
FIG. 4 is a circuit diagram illustrating a configuration example of a detection circuit of the first embodiment.

FIG. 4 is a circuit diagram illustrating a configuration example of a detection circuit 7 of the first embodiment. The detection circuit 7 illustrated in FIG. 4 includes a first variable resistor 7a, a second variable resistor 7b, and a comparator 7c.

The first variable resistor 7a and the second variable resistor 7b are connected in series between the VDD wiring line and the GND wiring line and are used for outputting voltage VDD/2. The comparator 7c includes a first input terminal to which detection signal $V_{DET}$ is input and a second input terminal to which the voltage VDD/2 is input.

The comparator 7c outputs control signal $V_{OUT}$, which corresponds to a comparison of $V_{DET}$ and VDD/2, from an output terminal. For example, the control signal $V_{OUT}$ is a binary signal which becomes at a high level when $V_{DET}$ is greater than or equal to VDD/2 and becomes at a low level when $V_{DET}$ is less than VDD/2.

When the control signal $V_{OUT}$ is at the high level, the bias application unit 3 adjusts the first bias voltage and second bias voltage such that the DC component of the output signal $V_5$ is decreased. On the other hand, when the control signal $V_{OUT}$ is at the low level, the bias application unit 3 adjusts the first bias voltage and second bias voltage such that the DC component of the output signal $V_5$ is increased. As a result, the value of the DC component of the output signal $V_5$ approaches VDD/2.

Figure 5A:
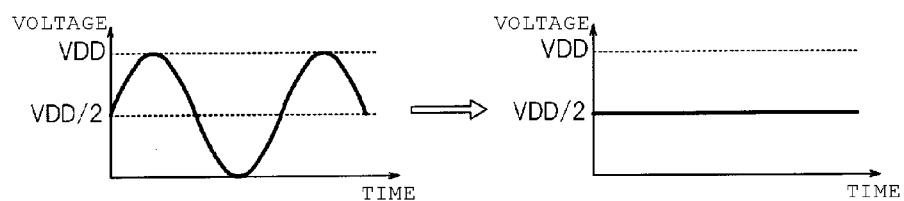
FIGS. 5A and 5B are waveform diagrams for explaining operations of the detection circuit of the first embodiment.
Figure 5B:
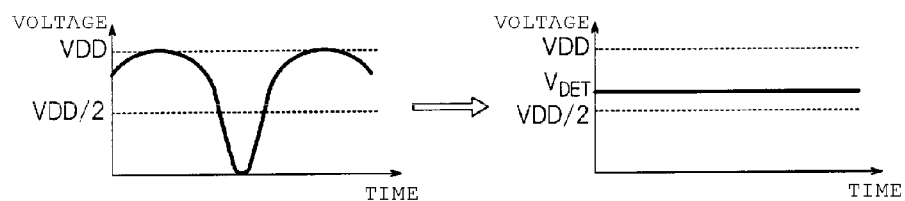

FIGS. 5A and 5B are waveform diagrams for explaining operations of the detection circuit 7 of the first embodiment. The left portion of FIG. 5A illustrates an example of an output signal $V_5$. The waveform of the depicted output signal $V_5$ approaches a sinusoidal wave and is substantially vertically symmetric. Accordingly, in this case, the value of the detection signal $V_{DET}$ becomes substantially VDD/2 (right portion of FIG. 5A).

The left portion of FIG. 5B illustrates another example of the output signal $V_5$. The waveform of the depicted output signal $V_5$ is far from a sinusoidal wave and is vertically asymmetric. Accordingly, in this case, the value of the detection signal $V_{DET}$ is deviated from the VDD/2 (left portion of FIG. 5B).

An output signal $V_5$ which is vertically asymmetric contains a lot of even-order harmonic components. The detection circuit 7 of the first embodiment detects such asymmetry using the detection signal $V_{DET}$ and outputs the control signal $V_{OUT}$ indicating the detection result to the bias application unit 3. With this, it is possible to improve symmetry of the waveform of the output signal $V_5$ and decrease the even order harmonic components contained in the output signal $V_5$.

Figure 6:
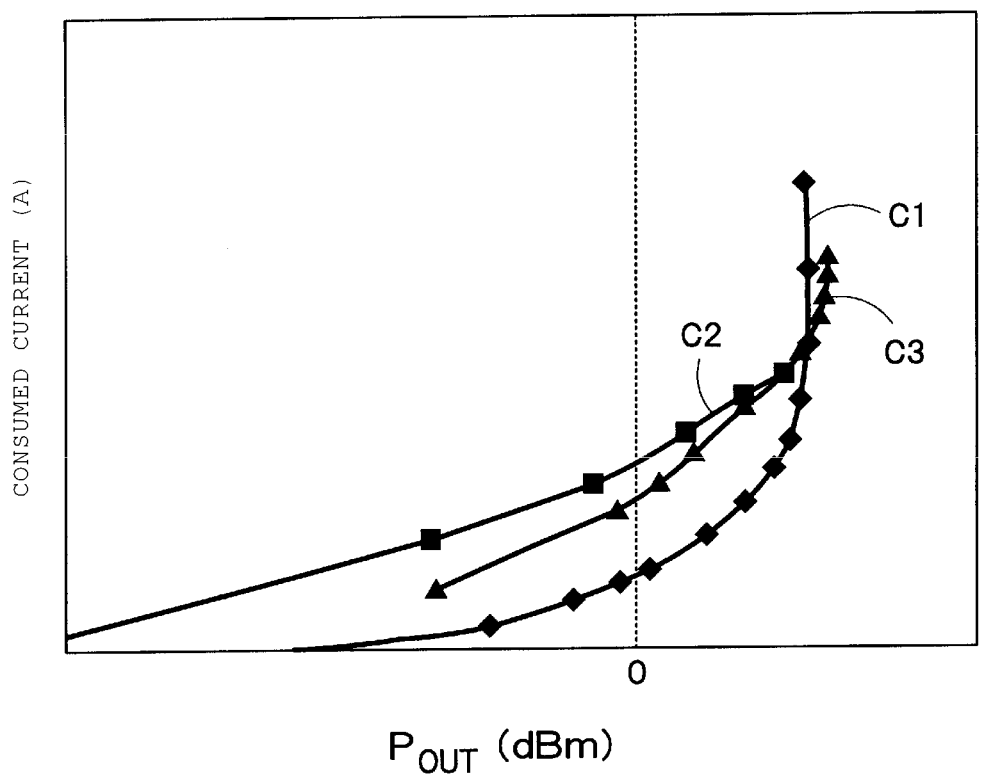
FIG. 6 is a graph for explaining performance of the wireless communication device of the first embodiment.

FIG. 6 is a graph for explaining performance of the wireless communication device of the first embodiment.

A curve C1 illustrates current consumption after the duty ratio has been adjusted as in FIG. 2A-E in the power amplifier 15 of the first embodiment. A curve C2 illustrates current consumption when the duty ratio has not been adjusted as in FIGS. 2A-2E in the power amplifier 15 of the first embodiment. A curve C3 illustrates current consumption when the duty ratio is adjusted as in FIGS. 2A-2E but the power amplifier 15 of the first embodiment is replaced with an nMOS-type power amplifier. Each of the curves C1-C3 illustrate results obtained by simulation. The abscissa of FIG. 6 represents power of an output signal $V_5$.

It may be understood, from the comparison of the curves C1 and C2, that the duty ratio adjustment of the first embodiment has effect for reducing current consumption. Furthermore, it may be understood, from the comparison of the curves C1 and C3, that the duty ratio adjustment of the first embodiment is suitable for the power amplifier 15 of the first embodiment.

Figure 7A:
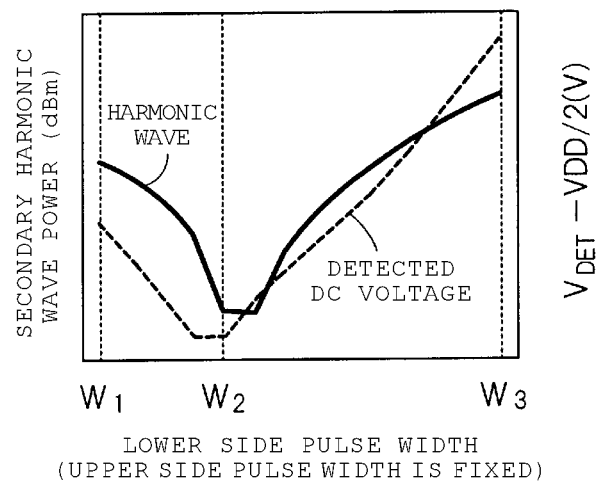
FIGS. 7A and 7B are other graphs for explaining performance of the wireless communication device of the first embodiment.
Figure 7B:
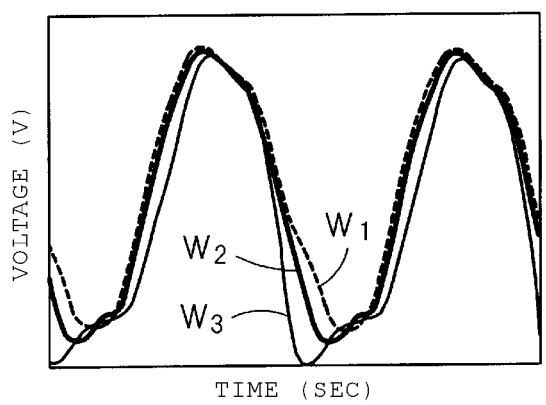

FIGS. 7A and 7B are graphs for explaining performance of the wireless communication device of the first embodiment. The abscissa of FIG. 7A represents the pulse width (lower side pulse width) of the first signal $V_{4P}$. The pulse width (upper side pulse width) of the second signal $V_{4N}$ is fixed. The ordinate of FIG. 7A illustrates power of the secondary harmonic wave contained in the output signal $V_5$ and a value of $V_{DET}$–VDD/2. The reference symbols $W_1$, $W_2$, and $W_3$ illustrates three types of a pulse width. FIG. 7A illustrates a shape in which when the lower side pulse width is $W_2$, the second order harmonic wave component is decreased and $V_{DET}$ approaches VDD/2.

FIG. 7B illustrates the output signal $V_5$ when the lower side pulse widths are $W_1$, $W_2$, and $W_3$. According to FIG. 7B, it is understood that when the lower side pulse width is $W_2$, the waveform of the output signal $V_5$ approaches a vertically symmetric shape.

As described above, the bias application unit 3 of the first embodiment applies bias to the first signal and the second signal based on the DC component of the output signal $V_5$. As such, according to the first embodiment, it becomes possible to adjust the duty ratio of the first signal and second signal by bias adjustments and adjust the waveform of the output signal $V_5$ to a desired waveform. According to the first embodiment, it becomes possible to improve symmetry of the waveform of the output signal $V_5$ and decrease the even order harmonic components output to the antenna 5.

Second Embodiment

Figure 8:
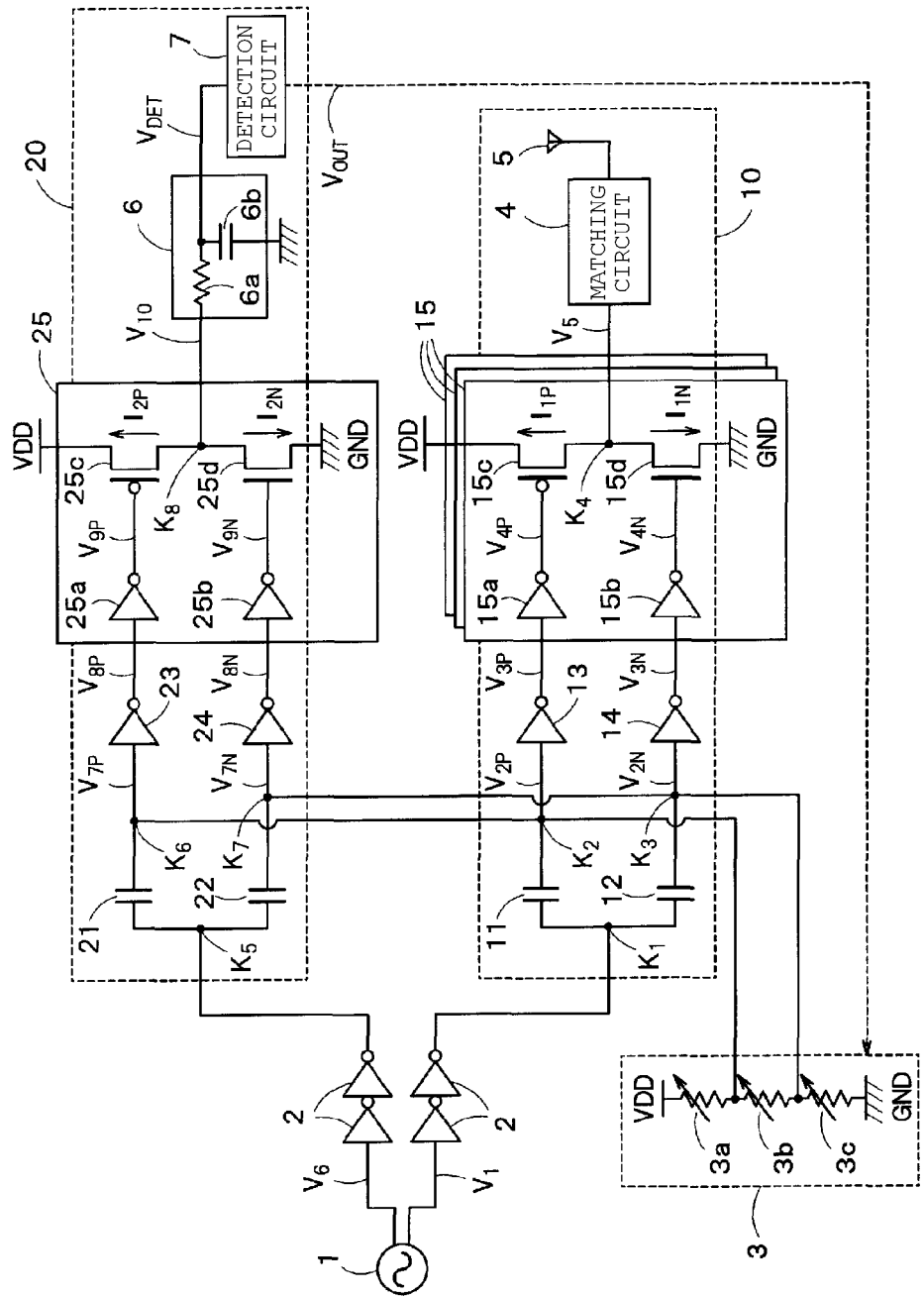
FIG. 8 is a circuit diagram illustrating a configuration of a wireless communication device of a second embodiment.

FIG. 8 is a circuit diagram illustrating a configuration of a wireless communication device of a second embodiment. The wireless communication device of FIG. 8, in addition to elements illustrated in FIG. 1, includes a first capacitor 21, a second capacitor 22, a first inverter 23, a second inverter 24, and a power amplifier 25. The power amplifier 25 includes a third inverter 25a, a fourth inverter 25b, a first transistor 25c, and a second transistor 25d. The first capacitor 21, the second capacitor 22, the first inverter 23, the second inverter 24, and the power amplifier 25 may have substantially the same configurations and functions as those of the first capacitor 11, the second capacitor 12, the first inverter 13, the second inverter 14, and the power amplifier 15, respectively.

A wireless communication device of FIG. 8 has a configuration in which the wireless transmission function and the DC component detection function in the wireless communication device of FIG. 1 are separated and includes a first circuit 10 specifically for wireless transmission and a second circuit 20 specifically for DC component detection. The second circuit 20 corresponds to a non-transmitting replica of the first circuit 10.

The first circuit 10 includes the first capacitor 11, the second capacitor 12, the first inverter 13, the second inverter 14, a plurality of power amplifiers 15, the matching circuit 4, and the antenna 5. The configurations and functions of these elements are similar to those of the first embodiment. The second circuit 20 includes the first capacitor 21, the second capacitor 22, the first inverter 23, the second inverter 24, the power amplifier 25, the filter circuit 6, and the detection circuit 7.

The signal generation unit 1 generates signals $V_1$ and $V_6$. The signal $V_1$ and the signal $V_6$ have the same waveform. The signal $V_6$ generate from the signal generation unit 1 is separated into a first signal supplied to the first capacitor 21 and a second signal supplied to the second capacitor 22 at a node $K_5$ after passing through the inverter(s) 2.

The first signal passing through the first capacitor 21 is supplied to a gate terminal of the first transistor 25c after passing through the first inverter 23 and the third inverter 25a. The second signal passing through the second capacitor 22 is supplied to a gate terminal of the second transistor 25d after passing through the second inverter 24 and the fourth inverter 25b. The first transistor 25c and the second transistor 25d are a pMOS transistor and an nMOS transistor, respectively, and constitute an inverter.

Here, the bias application unit 3 applies a first bias voltage to the first signal at a node $K_6$ between the first capacitor 21 and the first inverter 23. The first bias voltage is the same as that supplied to the node $K_2$. In FIG. 8, the first signal immediately after the first bias voltage is applied is indicated by the reference symbol $V_{7P}$, the first signal after passing through the first inverter 23 is indicated by the reference symbol $V_{8P}$, and the first signal after passing through the third inverter 25a is indicated by the reference symbol $V_{9P}$.

Similarly, the bias application unit 3 applies a second bias voltage to the second signal at a node $K_7$ between the second capacitor 22 and the second inverter 24. The second bias voltage is the same as that supplied to the node $K_3$. In FIG. 8, the second signal immediately after the second bias voltage is applied is indicated by the reference symbol $V_{7N}$, the second signal after passing through the second inverter 24 is indicated by the reference symbol $V_{8N}$, and the second signal after passing through the fourth inverter 25b is indicated by the reference symbol $V_{9N}$.

The first signal $V_{9P}$ is supplied to the first transistor 25c and the first current $I_{2P}$ is output from the first transistor 25c. The second signal $V_{9N}$ is supplied to the second transistor 25d and the second current $I_{2N}$ is output from the second transistor 25d. As a result, the output signal $V_{10}$ is output from the node $K_8$ between the first transistor 25c and the second transistor 25d to the filter circuit 6. The first current $I_{2P}$ and the second current $I_{2N}$ correspond to the drain current of the first transistor 25c and the drain current of the second transistor 25d, respectively. The output signal $V_{10}$ corresponds to the voltage of the node $K_8$, generated in the power amplifier 25 based on the first current $I_{2P}$ and the second current $I_{2N}$ and is output to the filter circuit 6 from the node $K_8$.

The output signal $V_{10}$ is supplied to the detection circuit 7 through the filter circuit 6. The filter circuit 6 is a low-pass filter configured with electrical resistor 6a and capacitor 6b and eliminates a high frequency component from the output signal $V_{10}$. The output signal $V_{10}$ after the high frequency component has been eliminated is output as the detection signal $V_{DET}$ to the detection circuit 7.

The detection circuit 7 is a circuit that detects the DC component in the output signal $V_{10}$, and specifically, detects the DC component in the output signal $V_{10}$ using the detection signal $V_{DET}$. The filter circuit 6 of the second embodiment eliminates substantially all AC components in the output signal $V_{10}$ and thus, the detection signal $V_{DET}$ substantially corresponds to the DC component of the output signal $V_{10}$. Accordingly, the detection circuit 7 is able to detect a value of the DC component of the output signal $V_{10}$ from a value of the detection signal $V_{DET}$.

The detection circuit 7 outputs a control signal $V_{OUT}$ corresponding to the DC component of the output signal $V_{10}$ to the bias application unit 3. The bias application unit 3 controls the first bias voltage and the second bias voltage based on the control signal $V_{OUT}$ to thereby adjust the duty ratios of the first signal and the second signal within both the first circuit 10 and the second circuit 20. As a result, a waveform of the output signal $V_5$ within the first circuit 10 is adjusted and the adjusted output signal $V_5$ is supplied to the matching circuit 4 and the antenna 5. Furthermore, a waveform of the output signal $V_{10}$ within the second circuit 20 is also adjusted and the adjusted output signal $V_{10}$ is supplied to the filter circuit 6 and the detection circuit 7.

As such, the wireless communication device of the second embodiment detects the DC component of the output signal $V_{10}$ using the detection circuit 7 and varies the waveforms of the output signals $V_5$ and $V_{10}$ based on the detection results from the detection circuit 7. With this, it is possible to adjust the waveforms of the output signals $V_5$ and $V_{10}$ to a desired waveform. Specifically, the wireless communication device of the second embodiment operates in such a way that the values of the DC components of the output signals $V_5$ and $V_{10}$ are brought closer to the VDD/2 to improve symmetry of the waveforms of the output signals $V_5$ and $V_{10}$.

According to the second embodiment, it becomes possible to adjust the duty ratio of the first signal and second signal within the first circuit 10 and the second circuit 20 by bias adjustments and to adjust the waveforms of the output signals $V_5$ and $V_{10}$ to a desired waveform.

The configuration of the second embodiment is suitable, for example, when the wireless transmission function and the DC component detection function of the wireless communication device are to be separated. On the other hand, the configuration of the first embodiment is suitable, for example, when the wireless communication device is intended to be configured with a smaller number of components.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A wireless communication device, comprising:
   a signal generator configured to generate a signal and supply the signal to a first input node;
   a first power amplifier connected to the first input node, the first power amplifier including a first inverter comprising a first transistor having a first gate electrode connected to the first input node via a first signal path and a second transistor having a second gate electrode connected to the first input node via a second signal path and configured to supply a first output signal corresponding to the signal supplied by the signal generator to the first input node, the first output signal being supplied from a first output node between the first and second transistors;
   a filter circuit connected to the first output node and configured to output a filtered output signal corresponding to the first output signal having a high frequency component removed therefrom; and
   a bias application unit configured to apply a first bias voltage to the first signal path and a second bias voltage to the second signal path, a level of the first bias voltage and a level of the second bias voltage being set according to a direct current component in the filtered output signal.

2. The wireless communication device according to claim 1, wherein the bias application unit adjusts the level of the first bias voltage to adjust a duty ratio of the signal propagated along the first signal path and the level of the second bias voltage to adjust a duty ratio of the signal propagated along the second signal path.

3. The wireless communication device according to claim 1, further comprising:
   a detection circuit receiving the filtered output signal from the filter circuit and configured to detect a level of the direct current component in the filtered output signal and output a control signal according to the detected level of the direct current component, wherein
   the bias application unit adjusts the first bias voltage and the second bias voltage according to control signal from the detection circuit.

4. The wireless communication device according to claim 3, further comprising:
   an impedance matching circuit connected between the filter circuit and the first output node.

5. The wireless communication device according to claim 1, further comprising:
   an impedance matching circuit connected between the first output node and an antenna from which a signal corresponding to the first output signal can be output.

6. The wireless communication device according to claim 1, further comprising:
   a second power amplifier connected to a second input node, the second power amplifier including a second inverter comprising a third transistor having a third gate electrode connected to the second input node via a third signal path and a fourth transistor having a fourth gate electrode connected to the second input node via a fourth signal path and configured to supply a second output signal corresponding to the signal supplied by the signal generator to the second input node, the second output signal being supplied from a second output node between the third and fourth transistors; and
   an impedance matching circuit connected between the second output node and an antenna, wherein
   the signal generator is further configured to supply the signal to a second input node, and
   the bias application unit is further configured to apply the first bias voltage to the third signal path and the second bias voltage to the fourth signal path.

7. The wireless communication device according to claim 6, wherein the bias application unit adjusts the level of the first bias voltage to adjust a duty ratio of the signal propagated along the first signal path and the level of the second bias voltage to adjust a duty ratio of the signal propagated along the second signal path.

8. The wireless communication device according to claim 6, further comprising:
a detection circuit receiving the filtered output signal from the filter circuit and configured to detect a level of the DC component in the filtered output signal and output a control signal according to the detected level of the direct current component, wherein
the bias application unit adjusts the first bias voltage and the second bias voltage according to control signal from the detection circuit.

9. The wireless communication device according to claim 1, wherein the bias application unit comprises a plurality of variable resistors connected in series between a power supply voltage and a ground voltage.

10. The wireless communication device according to claim 1, wherein the first power amplifier includes a plurality of power amplifiers connected in parallel.

11. A wireless communication method, comprising:
generating a signal and supplying the signal to a first input node,
supplying a first output signal corresponding to the signal supplied to the first input node from a first output node, the first output node being between a first transistor and a second transistor in a first inverter of a first power amplifier connected to the first input node, the first transistor having a first gate electrode connected to the first input node via a first signal path and the second transistor having a second gate electrode connected to the first input node via a second signal path;
removing a high frequency component from the first output signal to provide a filtered output signal; and
applying a first bias voltage to the first signal path and a second bias voltage to the second signal path, a level of the first bias voltage and a level of the second bias voltage being set according to a direct current component in the filtered output signal.

12. The method according to claim 11, further comprising:
supplying the first output signal to an antenna.

13. The method according to claim 11, further comprising:
supplying the first output signal to an impedance matching circuit; and
supplying a signal corresponding to the first output signal after passing through the impedance matching circuit to an antenna.

14. The method according to claim 11, further comprising:
detecting a level of the direct current component in the filtered output signal;
generating a control signal according to the level of the direct current component detected in the filtered output signal; and
setting the level of the first bias voltage and the second bias voltage according to the control signal.

15. The method of claim 11, further comprising:
supplying the signal to a second input node;
supplying a second output signal corresponding to the signal supplied to the second input node from a second output node of a second power amplifier, the second power amplifier having a third signal path connecting the second input node and a gate of a third transistor of a second inverter in the second power amplifier and a fourth signal path connecting the second input node and a gate of a fourth transistor of the second inverter; and
applying the first bias voltage to the third signal path and the second bias voltage to the fourth signal path.

16. The method of claim 15, further comprising:
transmitting the second output signal from an antenna after impedance matching.

17. A wireless communication device, comprising:
a first input node at which an input signal can be received;
a first power amplifier connected to the first input node, the first power amplifier including a first inverter comprising a first transistor having a first gate electrode connected to the first input node via a first signal path and a second transistor having a second gate electrode connected to the first input node via a second signal path and configured to supply a first output signal corresponding to the signal supplied by the signal generator to the first input node, the first output signal being supplied from a first output node between the first and second transistors;
a filter circuit connected to the first output node and configured to output a filtered output signal corresponding to the first output signal having a high frequency component removed therefrom; and
a bias application unit configured to apply a first bias voltage to the first signal path and a second bias voltage to the second signal path, a level of the first bias voltage and a level of the second bias voltage being set according to a direct current component in the filtered output signal.

18. The wireless communication device according to claim 17, wherein the bias application unit adjusts the level of the first bias voltage to adjust a duty ratio of the signal propagated along the first signal path and the level of the second bias voltage to adjust a duty ratio of the signal propagated along the second signal path.

19. The wireless communication device according to claim 17, further comprising:
a detection circuit receiving the filtered output signal from the filter circuit and configured to detect a level of the direct current component in the filtered output signal and output a control signal according to the detected level of the direct current component, wherein
the bias application unit adjusts the first bias voltage and the second bias voltage according to control signal from the detection circuit.

20. The wireless communication device according to claim 17, further comprising:
a second input node at which the input signal can be received;
a second power amplifier connected to the second input node, the second power amplifier including a second inverter comprising a third transistor having a third gate electrode connected to the second input node via a third signal path and a fourth transistor having a fourth gate electrode connected to the second input node via a fourth signal path and configured to supply a second output signal corresponding to the signal supplied by the signal generator to the second input node, the second output signal being supplied from a second output node between the third and fourth transistors; and
an impedance matching circuit connected between the second output node and an antenna, wherein
the bias application unit is further configured to apply the first bias voltage to the third signal path and the second bias voltage to the fourth signal path.

* * * * *